United States Patent
Chou et al.

(10) Patent No.: US 9,608,060 B2
(45) Date of Patent: Mar. 28, 2017

(54) ISOLATION STRUCTURE FOR SEMICONDUCTOR DEVICE

(71) Applicant: TAIWAN SEMICONDUCTOR MANUFACTURING CO., LTD., Hsinchu (TW)

(72) Inventors: Yu-Chieh Chou, New Taipei (TW); Tsai-Feng Yang, Ruisui Township (TW); Chun-Yi Yang, Hsinchu (TW); Kun-Ming Huang, Taipei (TW); Shen-Ping Wang, Keelung (TW); Lieh-Chuan Chen, Hsinchu (TW); Po-Tao Chu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 65 days.

(21) Appl. No.: 14/535,110

(22) Filed: Nov. 6, 2014

(65) Prior Publication Data

US 2016/0133698 A1 May 12, 2016

(51) Int. Cl.

| | | |
|---|---|---|
| H01L 21/762 | (2006.01) | |
| H01L 29/735 | (2006.01) | |
| H01L 29/739 | (2006.01) | |
| H01L 29/06 | (2006.01) | |

(52) U.S. Cl.
CPC .... *H01L 29/0653* (2013.01); *H01L 21/76224* (2013.01); *H01L 21/76232* (2013.01); *H01L 21/76237* (2013.01); *H01L 21/76283* (2013.01); *H01L 29/7393* (2013.01); *H01L 29/7394* (2013.01)

(58) Field of Classification Search
None
See application file for complete search history.

(56) References Cited

U.S. PATENT DOCUMENTS

| | | | | |
|---|---|---|---|---|
| 5,573,973 A | * | 11/1996 | Sethi | H01L 21/76232 148/DIG. 138 |
| 2002/0053717 A1 | * | 5/2002 | Sumida | H01L 21/76264 257/565 |

OTHER PUBLICATIONS

Silicon on insulator, Wikipedia, Jul. 1, 2013.*

* cited by examiner

*Primary Examiner* — Robert Bachner
*Assistant Examiner* — Molly Reida
(74) *Attorney, Agent, or Firm* — Maschoff Brennan

(57) ABSTRACT

A semiconductor structure includes a substrate, a semiconductor device in the substrate, and an isolating structure in the substrate and adjacent to the semiconductor device. The isolating structure has a roughness surface at a sidewall of the isolating structure, and the roughness surface includes carbon atoms thereon.

18 Claims, 12 Drawing Sheets

ISOLATION STRUCTURE FOR SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

On the other hand, such scaling down process increases the complexity of processing and manufacturing ICs and, for these advances to be realized, similar developments in IC processing and manufacturing are needed. For example, a silicon-on-oxide (SOI) substrate has been introduced to replace a bulk substrate. The SOI substrate has higher operating speed and provides better electrical insulation. In the manufacturing process of the devices in the SOI substrate, further improvements are constantly necessary to satisfy the performance requirement in the scaling down process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
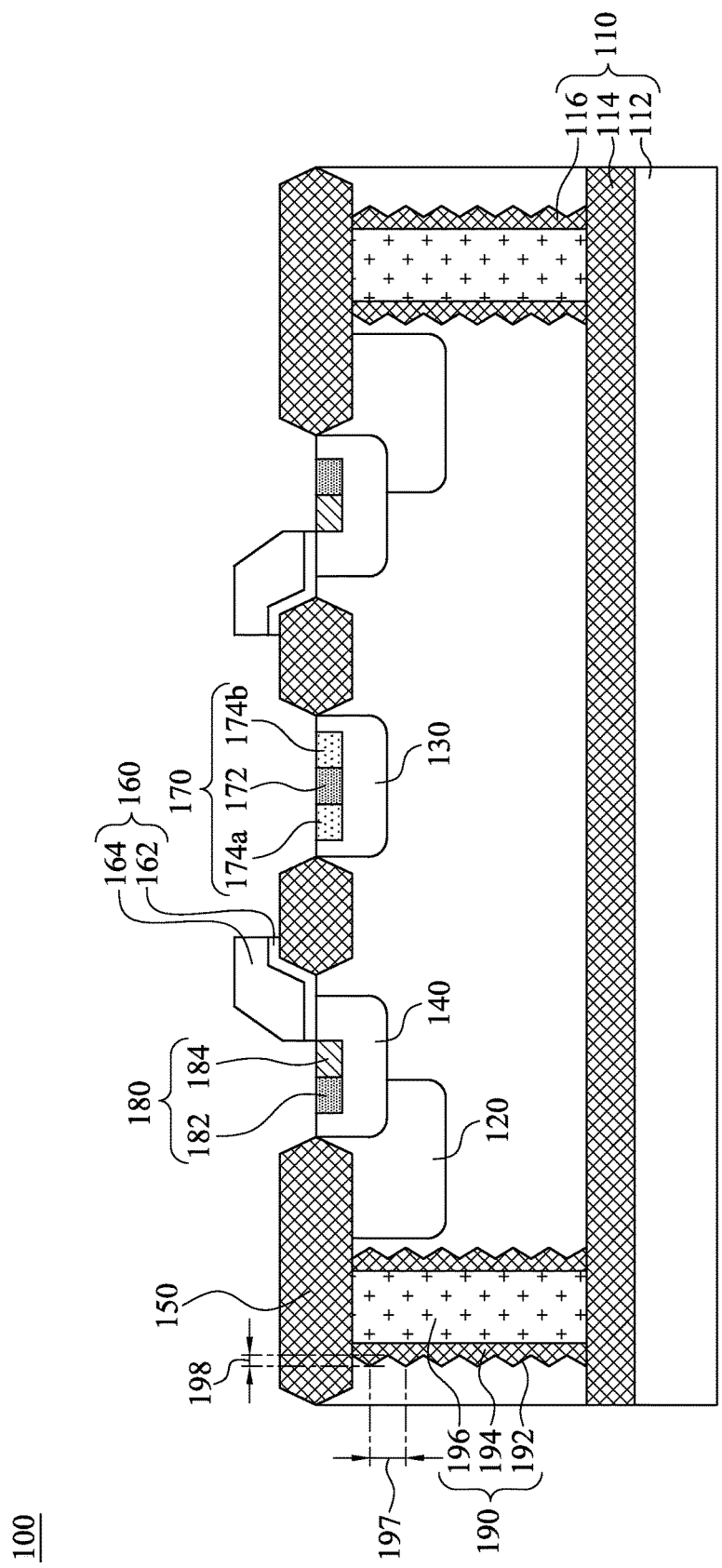
FIG. 1 is a cross-sectional view of a semiconductor structure, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, metal contaminations are remained in a semiconductor layer of a silicon-on-oxide (SOI) substrate during the manufacturing process, since an insulating layer acts as barrier to block vertical diffusion of the metal contamination. Also, dangling bonds are formed at a contact surface between the semiconductor layer and the insulating layer. These impurities remain trapped and causing a degradation in the quality of the gate oxide integrity (GOI), and thus decreases the performance of semiconductor devices.

Please refer to FIG. 1, FIG. 1 is a cross-sectional view of a semiconductor structure, according to various embodiments of the present disclosure. A semiconductor structure 100 includes a SOI substrate 110 having a handle substrate 112, a semiconductor layer 116, and an insulating layer 114 interposed between the handle substrate 110 and the semiconductor layer 116. The handle substrate 112 and the semiconductor layer 116 may include silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In embodiments, the handle substrate 112 may include glass or sapphire.

An insulated gate bipolar transistor (IGBT) device is fabricated in the SOI substrate 110, which the IGBT device is symmetrical. As shown in FIG. 1, the semiconductor layer 116 has a first type of conductivity, and deep wells 120 with a second type of conductivity are formed in the semiconductor layer 116, which the second type of conductivity is a different conductivity type as the first type of conductivity. A first well 130 and second wells 140 are formed in the semiconductor layer 116, which the first well 130 is between the two second wells 140. To be noticed, a portion of the second well 140 is positioned in the deep well 120, and another potion of the second well 140 is positioned in the semiconductor layer 116. Besides, the first well 130 has the same conductivity type as the semiconductor layer 116, and the second wells 140 have the different conductivity type as the semiconductor layer 116.

Continuing in FIG. 1, the semiconductor structure 100 further includes a field oxide 150 on the semiconductor layer 116, which the field oxide layer 150 may include silicon oxide, silicon nitride, silicon oxynitride, aluminum oxide, or other suitable materials. A gate structure 160 includes a first portion overlying the second well 140, a second portion overlying the semiconductor layer 116, and a third portion overlying the field oxide 150. The gate structure 160 includes a gate dielectric 162 and a gate electrode 164 on the gate dielectric 162. The gate dielectric 162 may include a silicon oxide layer suitable for high voltage applications. Alternatively, the gate dielectric 162 may optionally include a high-k dielectric material, silicon oxynitride, other suitable materials, or combinations thereof. The high-k dielectric material is selected from metal oxides, metal nitrides, metal silicates, transition-metal oxides, transition-metal nitrides, transition-metal silicates, oxynitrides of metals, metal aluminates, zirconium silicate, zirconium aluminate, hafnium oxide, or combinations thereof. In embodiments, the gate dielectric 162 may have a multilayer structure, such as one layer of silicon oxide and another layer of high-k material. The gate dielectric 162 may be formed using chemical vapor deposition (CVD), physical vapor deposition (PVD), atomic layer deposition (ALD), thermal oxide, other suitable processes, or combinations thereof.

The gate electrode 164 is disposed on the gate dielectric 162, which the gate electrode 164 may be a doped or non-doped polysilicon. Alternatively, the gate electrode layer 164 may include a metal, such as Ti, Ag, Al, TiAlN, TaC, TaCN, TaSiN, Mn, Zr, TiN, TaN, Ru, Mo, Al, WN, Cu, W, any suitable materials, or a combination thereof. The gate electrode 164 is formed using CVD, PVD, ALD, plating, or other processes. The gate electrode 164 may have a multilayer structure and may be formed in a multiple-step process.

A drain region 170 is formed in the top surface of the first well 130, which the drain region 170 is located across the field oxide 150 from the gate structure 160. A source region 180 is formed in the top surface of the second well 140, which the source region 180 is located across the gate structure 160 from the drain region 170. Besides, the source region 180 includes two oppositely doped regions both formed in the top surface of the second well 140. A first source region 182 of the source region 180 has the second type of conductivity, which is same as the second well 140, and a second source region 184 of the source region 180 has the first type of conductivity. Also, the drain region 170 includes two regions having the second type of conductivity. A first drain region 172 is heavily doped with dopants having the second type of conductivity, and the second drain regions 174a and 174b are lightly doped with dopants having the second type of conductivity, which the first region 172 is interposed between the second regions 174a and 174b.

In embodiments, the first type of conductivity is an n-type, and the second type of conductivity is a p-type. In various embodiments, the first type of conductivity is a p-type, and the second type of conductivity is an n-type.

Since a lattice constant of the insulating layer 114 and a lattice constant of the semiconductor layer 116 are different, a dislocation between the insulating layer 114 and the semiconductor layer 116 will form a plurality of dangling bonds. These dangling bonds are normally uncharged but could become charged when electrons or holes migrating to a contact surface 115 between the insulating layer 114 and the semiconductor layer 116. For example, high-energy electrons or holes could charge the dangling bonds, and these high-energy electrons or holes are referred as hot carriers. In operation, these hot carriers will cause current leakage or voltage swell, and thus significantly decrease gate oxide integrity (GOI) performance of the IGBT device.

Referring to FIG. 1, the semiconductor structure 100 further includes an isolating structure 190 in the semiconductor layer 116 for gettering the dangling bonds and metal contaminations. The isolating structure 190 is disposed adjacent to the IGBT device and extending from a top surface of the semiconductor layer 116 to the contact surface 115 between the semiconductor layer 116 and the insulating layer 114. The meaning of adjacent is that the isolating structure 190 is near or close to, but not necessarily in contact with the IGBT device. The isolating structure 190 includes a first roughness surface 192, which is at sidewalls of the isolating structure 190. The first roughness surface 192 provides the capability of gettering the impurities, such as dangling bonds or metal contaminations. The impurities gettered by the first roughness surface 192 will be trapped in the isolating structure 190, and thus enhances the GOI performance of the IGBT device.

In embodiments, the semiconductor structure has a plurality of isolating structures 190, and the isolating structures 190 occupy at least 1 percent of a surface area of the semiconductor layer 116. More specifically, the isolating structures 190 occupy at least 1 percent of a surface area of each field on the wafer.

In embodiments, the first roughness surface 192 has a roughness in a range from about 2.5 um to about 10 um. In various embodiments, the first roughness surface 192 has the roughness in a range from about 3 um to about 8 um.

In embodiments, the first roughness surface 192 has a zigzag-shape profile, but not limited thereto, and some carbon atoms will remain on the first roughness surface 192. In embodiments, each zigzag includes a width 197 and a depth 198, and an aspect ratio of the depth 198 to the width 197 is in a range from about 0.2 to about 1. In various embodiments, the aspect ratio is in a range from about 0.4 to about 0.8.

A trench is formed in the semiconductor layer 116, and sidewalls of the trench are impacted to obtain the first roughness surface 192. A liner 194 is deposited along the sidewalls of the trench and conformably wrapping over the first roughness surface 192, and a dielectric material 196 is deposited to fully fill the trench. The liner 194 may include silicon oxide, silicon nitride, silicon oxynitride, aluminum oxide, or other suitable materials, and the dielectric material 196 may include silicon oxide, silicon nitride, silicon oxynitride, spin-on-glass, spin-on-polymer, or other suitable materials, or combinations thereof.

In embodiments, the isolating structure 190 further includes a second roughness surface at sidewalls of the liner 194. More specifically, the second roughness surface is interposed between the liner 194 and the dielectric material 196. In various embodiments, the isolating structure 190 further includes a gettering layer interposed between the first roughness surface 192 and the liner 194, to enhance the capability of gettering impurities. The gettering layer may be formed of polysilicon.

In embodiments, the second roughness surface has a roughness in a range from about 2.5 um to about 10 um. In various embodiments, the second roughness surface has the roughness in a range from about 3 um to about 8 um.

In embodiments, each zigzag includes a width and a depth, and an aspect ratio of the depth to the width is in a range from about 0.2 to about 1. In various embodiments, the aspect ratio is in a range from about 0.4 to about 0.8.

Figure 2:
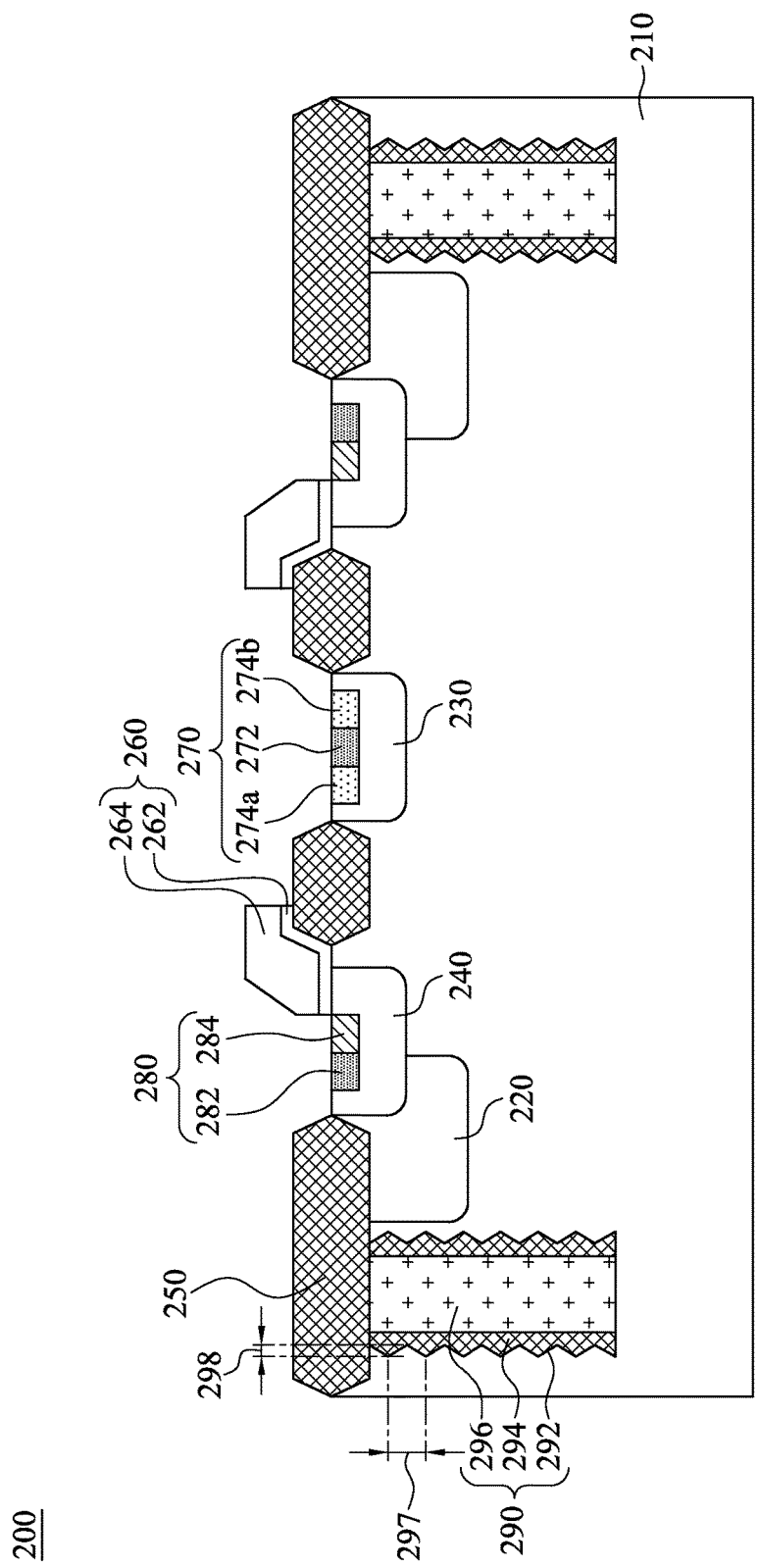
FIG. 2 is a cross-sectional view of a semiconductor structure, in accordance with various embodiments of the present disclosure.

Please refer to FIG. 2, FIG. 2 is a cross-sectional view of a semiconductor structure, according to various embodiments of the present disclosure. A semiconductor structure 200 includes a bulk substrate 210. The bulk substrate 210 may include silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof.

An insulated-gate bipolar transistor (IGBT) device is fabricated in the bulk substrate 210, which the IGBT device is symmetrical. As shown in FIG. 1, the bulk substrate 210 has a first type of conductivity, and deep wells 220 with a second type of conductivity are formed in the bulk substrate 210, which the second type of conductivity is different conductivity type as the first type of conductivity. A first well 230 and two second wells 240 are formed in the bulk substrate 210, which the first well 230 is between the two second wells 140. Besides, the first well 230 has the same conductivity type as the bulk substrate 210, and the second wells 240 have the different conductivity type as the bulk substrate 210.

The semiconductor structure 200 further includes a field oxide 250 on the bulk substrate 210, which the field oxide 250 may include silicon oxide, silicon nitride, silicon oxynitride, aluminum oxide, or other suitable materials. A gate structure 260 includes a first portion overlying the second well 240, a second portion overlying the bulk substrate 210, and a third portion overlying the field oxide 250. The gate structure 260 includes a gate dielectric 262 and a gate electrode 264 on the gate dielectric 262. The gate dielectric 262 may include a silicon oxide layer suitable for high voltage applications. Alternatively, the gate dielectric 262 may optionally include a high-k dielectric material, silicon oxynitride, other suitable materials, or combinations thereof. The high-k dielectric material is selected from metal oxides, metal nitrides, metal silicates, transition-metal oxides, transition-metal nitrides, transition metal-silicates, oxynitrides of metals, metal aluminates, zirconium silicate, zirconium aluminate, hafnium oxide, or combinations thereof. In embodiments, the gate dielectric 262 may have a multilayer structure, such as one layer of silicon oxide and another layer of high-k material.

The gate electrode 264 is disposed on the gate dielectric 262, which the gate electrode 264 may includes a doped or non-doped polysilicon. Alternatively, the gate electrode layer 264 may include a metal, such as Ti, Ag, Al, TiAlN, TaC, TaCN, TaSiN, Mn, Zr, TiN, TaN, Ru, Mo, Al, WN, Cu, W, any suitable materials or a combination thereof.

A drain region 270 is formed in the top surface of the first well 230, which the drain region 270 is located across the field oxide 250 from the gate structure 260. A source region 280 is formed in the top surface of the second well 240, which the source region 280 is located across the gate structure 260 from the drain region 270. The source region 280 includes two oppositely doped regions both formed in the top surface of the second well 240. A first source region 282 of the source region 280 has the second type of conductivity, which is same as the second well 240, and a second source region 284 of the source region 280 has the first type of conductivity. Also, the drain region 270 includes two regions having the second type of conductivity. A first drain region 272 is heavily doped with dopants having the second type of conductivity, and the second drain regions 274a and 274b are lightly doped with dopants having the second type of conductivity, which the first drain region 272 is interposed between the second drain regions 274a and 274b.

In embodiments, the first type of conductivity is an n-type, and the second type of conductivity is a p-type. In various embodiments, the first type of conductivity is a p-type, and the second type of conductivity is an n-type.

Even through the dangling bonds will not form in the bulk substrate 210, the isolating structure with the roughness surface still could be applied for gettering impurities in the bulk substrate 210, such as metal contaminations. Continuing in FIG. 2, the semiconductor structure 200 further includes an isolating structure 290 in the bulk substrate 210 for gettering the impurities. The isolating structure 290 is disposed adjacent to the IGBT device and extending downward from a top surface of bulk substrate 210. The isolating structure 290 includes a first roughness surface 292, which is at sidewalls of the isolating structure 290. The first roughness surface 292 provides the capability of gettering the impurities. The impurities gettered by the first roughness surface 292 will be trapped in the isolating structure 290, and thus enhances the GOI performance of the semiconductor device. In embodiments, a bottom of the isolating structure 290 is lower than the deep well 220.

In embodiments, the semiconductor structure has a plurality of isolating structures 290, and these isolating structures 290 occupy at least 1 percent of a surface area of the bulk substrate 210. More specifically, the isolating structures 290 occupy at least 1 percent of a surface area of each field on the wafer.

In embodiments, the first roughness surface 292 has a roughness in a range from about 2.5 um to about 10 um. In various embodiments, the first roughness surface 292 has the roughness in a range from about 3 um to about 8 um.

In embodiments, the first roughness surface 292 has a zigzag-shape profile, but not limited thereto, and some carbon atoms will remain on the first roughness surface 292. In embodiments, each zigzag includes a width 297 and a depth 298, and an aspect ratio of the depth 298 to the width 297 is in a range from about 0.2 to about 1. In various embodiments, the aspect ratio is in a range from about 0.4 to about 0.8.

A trench is formed in the bulk substrate 112, and sidewalls of the trench are impacted to obtain the first roughness surface 292. A liner 294 is deposited along the sidewalls of the trench and conformably wrapping over the first roughness surface 292, and a dielectric material 296 is deposited to fill the trench. The liner 294 may include silicon oxide, silicon nitride, silicon oxynitride, aluminum oxide, or other suitable materials, and the dielectric material 296 may include silicon oxide, silicon nitride, silicon oxynitride, spin-on-glass, spin-on-polymer, or other suitable materials, or combinations thereof.

Figure 3:
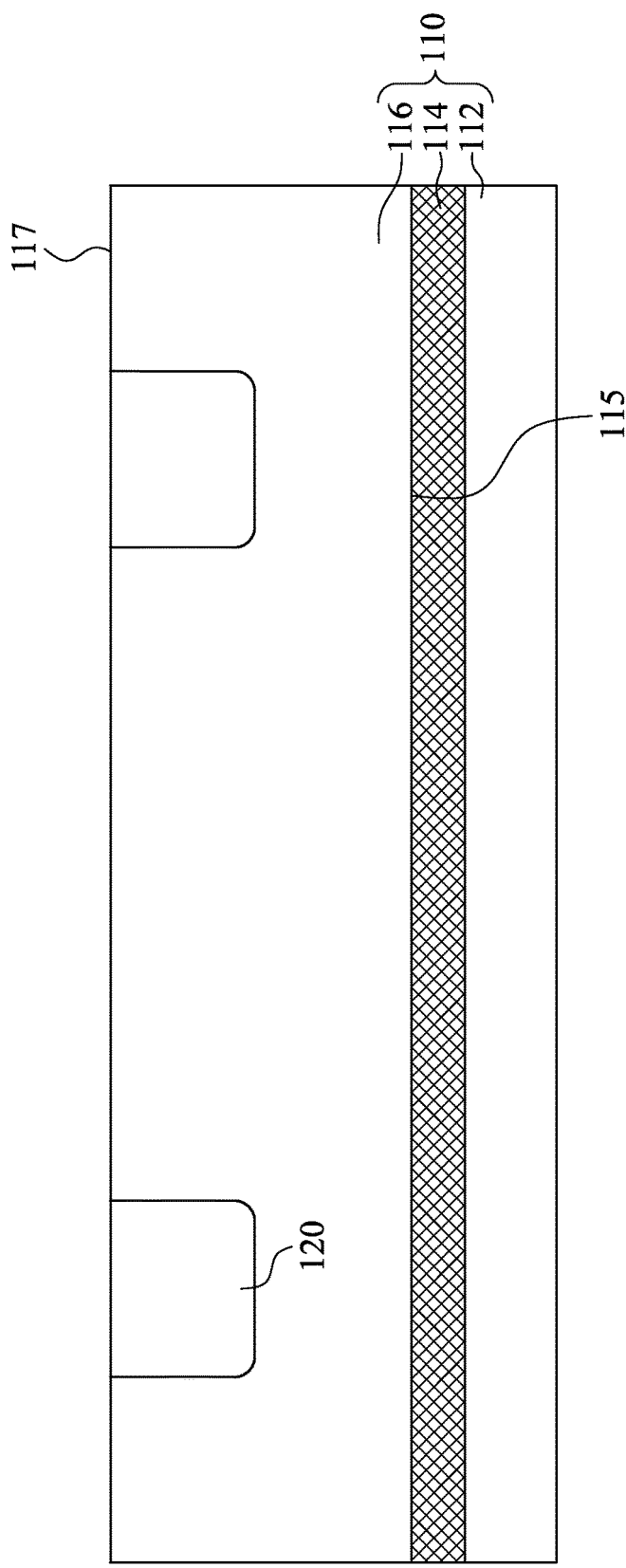
FIGS. 3-10 are cross-sectional views of the semiconductor structure in FIG. 1 at an intermediate stage of fabrication, in accordance with various embodiments of the present disclosures.

FIG. 3-10 are cross-sectional views of the semiconductor structure in FIG. 1 at an intermediate stage of fabrication, in accordance with various embodiments. Please refer to FIG. 3, the substrate is provided. The present disclosure illustrates a silicon-on-insulator (SOI) substrate, but the bulk substrate also could be applied in the present disclosure. The SOI substrate 110 includes the handle substrate 112, the insulating layer 114 on the handle substrate 112, and the semiconductor layer 116 on the insulating layer 114. The SOI substrate 110 may be formed using various SOI technologies, such as, separation by implanted oxygen (SIMOX), wafer bonding, and/or other suitable methods. For example, using a SIMOX technology to form the insulating layer 114. The SIMOX technology is based on ion-implanting a high-dose of oxygen ions into a silicon wafer, such that the peak concentration lies beneath the silicon surface. After implanting, these wafers are subjected to a high-temperature anneal (about 1150° C. to about 1400° C.) to form a continuous stoichiometric subsurface-layer of silicon dioxide. Thus, the insulating layer 114 (also referred as buried oxide, BOX) is formed between the semiconductor layer 116 and the handle substrate 112 to electrically separate the semiconductor layer 116 and the handle substrate 112. The semiconductor layer 116 has the first type of conductivity. For example, as shown in FIG. 3, the semiconductor layer 116 may be an n-type semiconductor layer.

Figure 4:
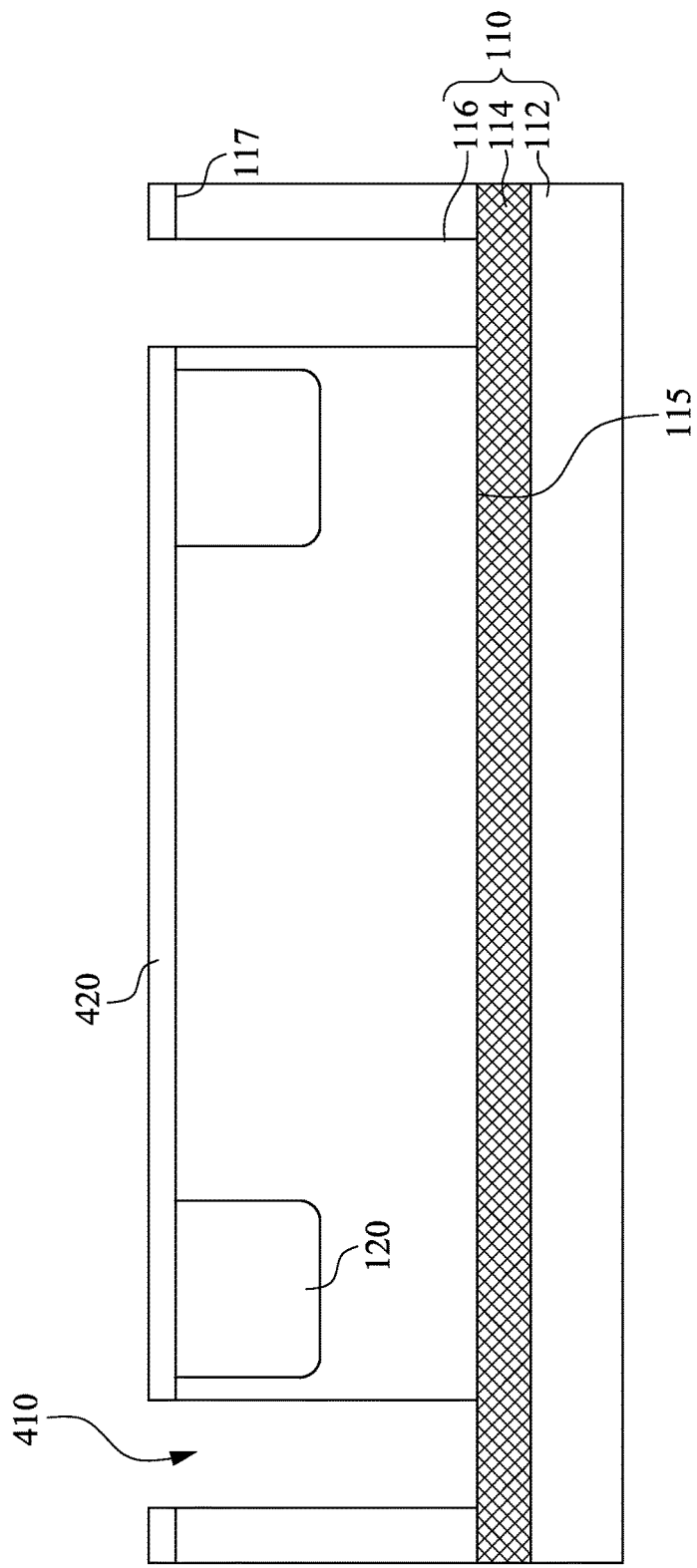

Continuing in FIG. 3, deep wells 120 are formed in the semiconductor layer 116. The deep well 120 has the second type of conductivity, which is different as the first type of conductivity of the semiconductor layer 116. As shown in FIG. 4, the deep well 120 may be formed by a plurality of processing steps, such as growing a sacrificial oxide on the semiconductor layer 116, opening a pattern for the location(s) of the deep well 120, and implanting the dopants. For example, the deep well 120 is doped with a p-type dopant, such as boron or $BF_2$. In embodiments, the deep well 120 may be formed using ion implantation, plasma-based ion implantation, gaseous or solid source thermal diffusion, deposition, or combinations thereof. In various embodiments, a p-type dopant concentration in the deep well 120 is in a range from about $10^{17}$ atoms/cm$^3$ to about $10^{18}$ atoms/cm$^3$.

Referring to FIG. 4, a trench 410 is formed adjacent to the deep well 120. As shown in FIG. 4, a trench hard mask 420 is formed on a top surface 117 of the semiconductor layer 116 to expose the semiconductor layer 116. A process of fabricating the trench hard mask 420 may include forming a photoresist layer (not shown) overlying a hard mask, exposing the photoresist layer to form a pattern, performing post-exposure bake processes, and developing the pattern to form the trench hard mask 420. Then, an etching process is applied to etch the semiconductor layer 116 through the trench hard mask 420, which the etching process is controlled to stop at a contact surface 115 between the semiconductor layer 116 and the insulating layer 114. The etching process forms the trench 410 extending from the top surface 117 of the semiconductor layer 116 to the contact surface 115 between the semiconductor layer 116 and the insulating layer 114. In embodiments, a width of the trench is at least 100 nm. In various embodiments, the etching process may be dry etching, wet etching, and/or other etching methods.

In embodiments, the semiconductor structure has a plurality of trenches 410, and these trenches 410 occupy at least 1 percent of a surface area of the semiconductor layer 116. More specifically, the trenches 410 occupy at least 1 percent of a surface area of each field on the wafer.

Figure 5:
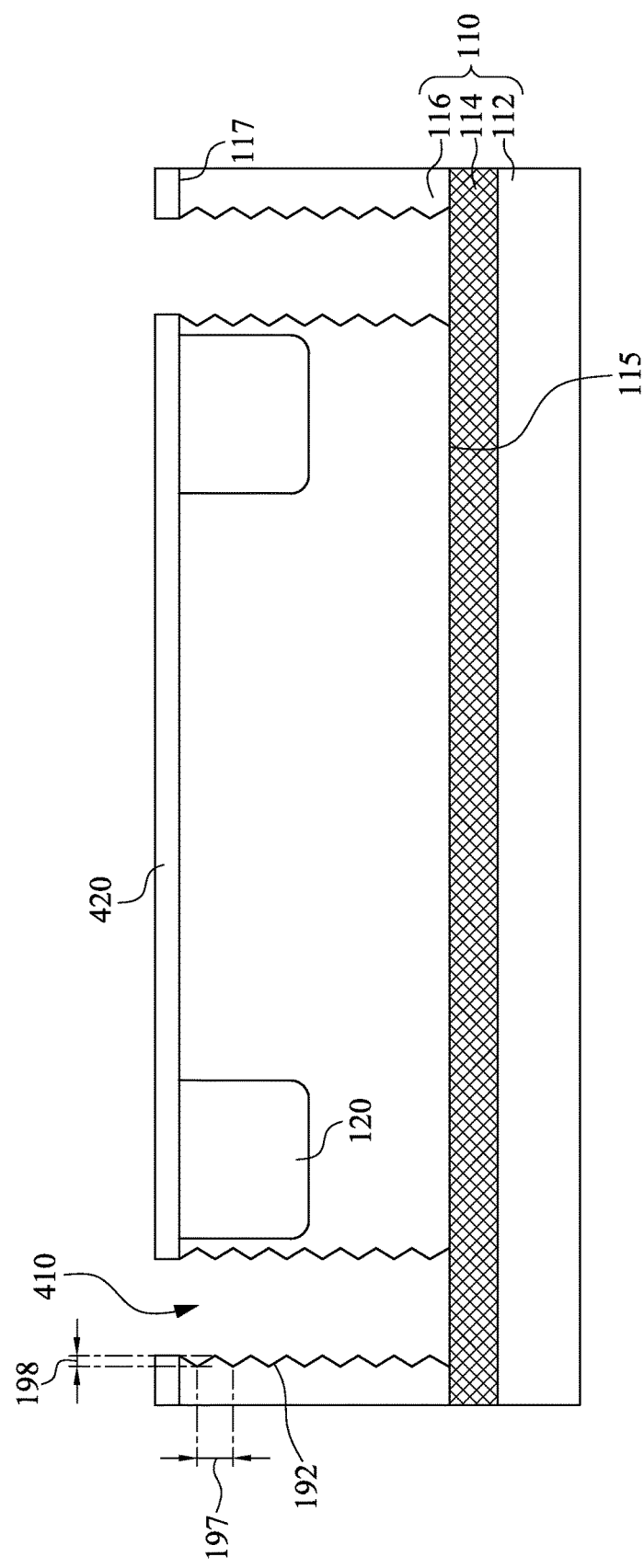

Referring to FIG. 5, sidewalls of the trench 410 are roughened. As shown in FIG. 5, the first roughness surface 192 is formed at sidewalls of the trench 410. An implanter generates high-speed and high-energy carbon atoms impacting the sidewalls 412 of the trench 410, to form the first roughness surface 192. The first roughness surface 192 has larger entropy than a flat surface, and thus enhances the capability of gettering impurities. The first roughness surface 192 has a zigzag-shape profile, but not limited thereto, and some carbon atoms will remain on the first roughness surface 192.

In embodiments, the first roughness surface 192 has a roughness in a range from about 2.5 um to about 10 um. In various embodiments, the first roughness surface 192 has the roughness in a range from about 3 um to about 10 um.

In embodiments, each zigzag includes a width 197 and a depth 198, and an aspect ratio of the depth 198 to the width 197 is in a range from about 0.2 to about 1. In various embodiments, the aspect ratio is in a range from about 0.4 to about 0.8.

Figure 6A:
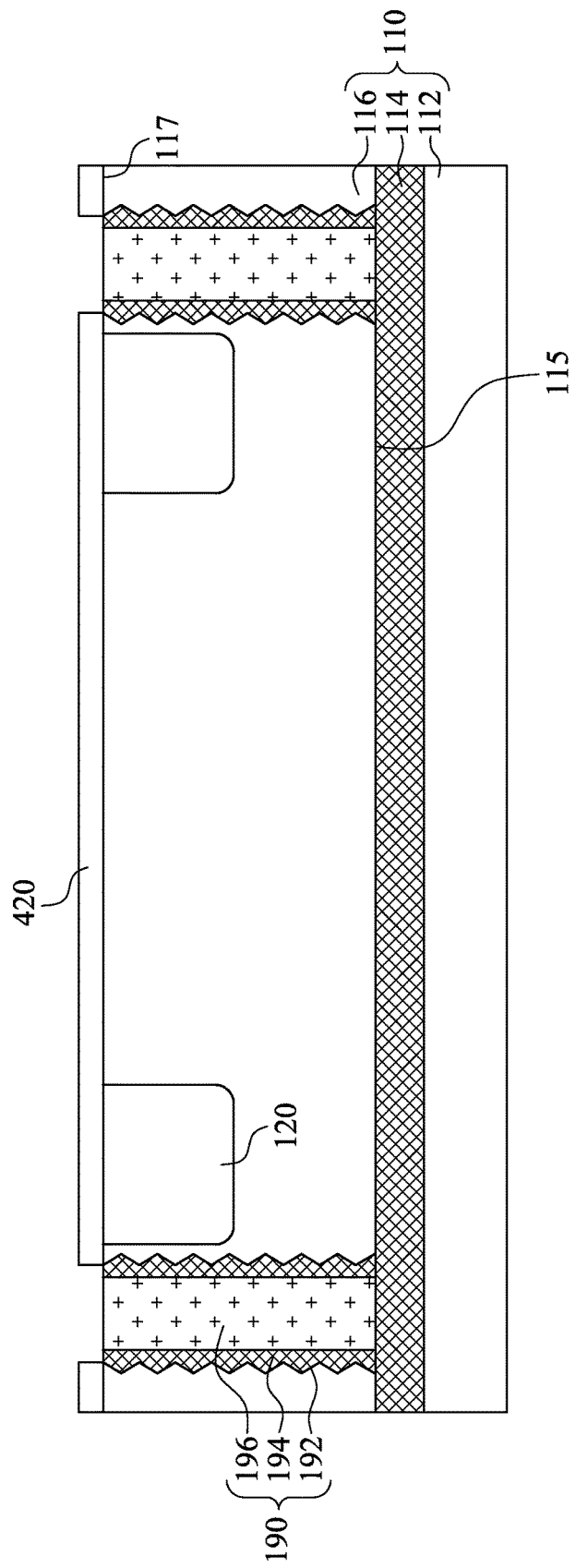
Figure 6B:
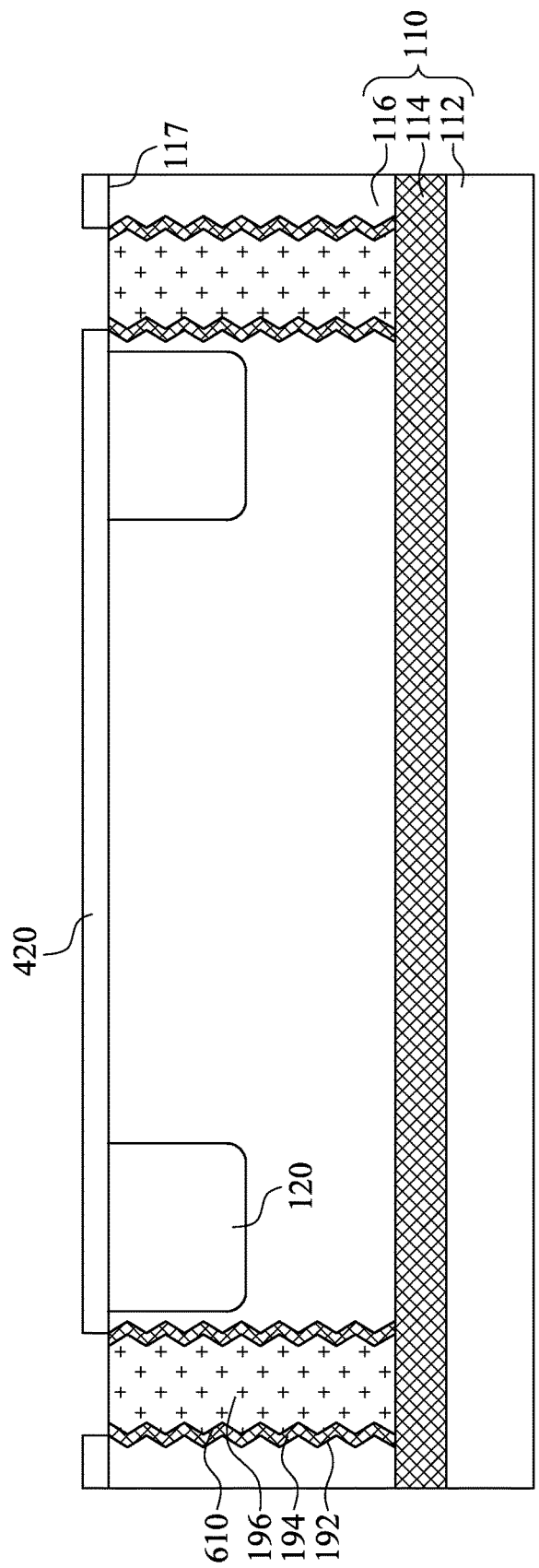
Figure 6C:
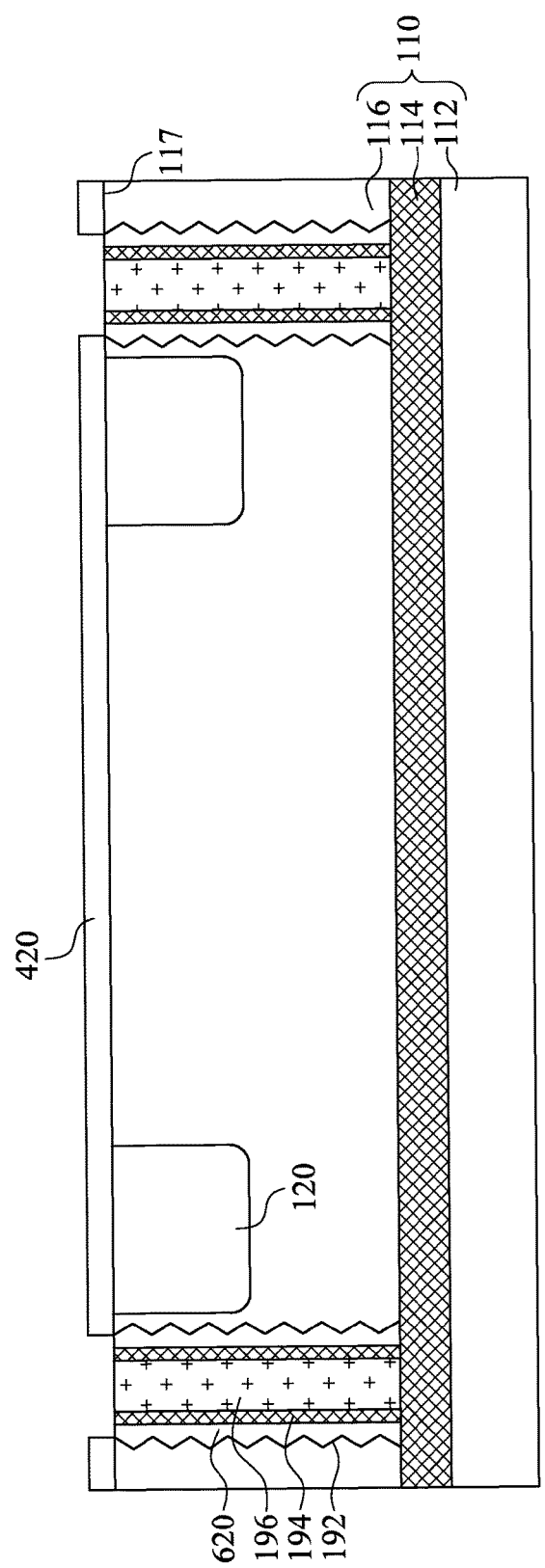

Continuing to FIG. 6A, the liner 194 and the dielectric material 196 are deposited in the trench 410. As shown is FIG. 6A, the liner is deposited along the sidewalls of the trench 410 to cover the first roughness surface 192. The liner 194 may include silicon oxide, silicon nitride, silicon oxynitride, aluminum oxide, or other suitable materials, and the liner 194 may be formed using chemical vapor deposition (CVD), physical vapor deposition (PVD), atomic layer deposition (ALD), thermal oxide, other suitable processes, or combinations thereof. The dielectric material 196 is deposited over the liner 405, including fully filling the trench 410. The dielectric material 196 may include silicon oxide, silicon nitride, silicon oxynitride, spin-on-glass, spin-on-polymer, or other suitable materials, or combinations thereof. The dielectric material 196 may be deposited using CVD, physical vapor deposition (PVD), ALD, thermal oxidation, spin-on coating, or other suitable techniques, or a combination thereof.

In embodiments, after depositing the liner 194, sidewalls of the liner 194 are roughened. Please referring to FIG. 6B, a second roughness surface 610 is formed at the sidewalls of the liner 194. The implanter generates high-speed and high-energy carbon atoms impacting the sidewalls of the liner 194, to form the second roughness surface 610. The second roughness surface 610 has a zigzag-shape profile, but not limited thereto, and some carbon atoms will remain on the second roughness surface 610.

In embodiments, the second roughness surface 610 has a roughness in a range from about 2.5 um to about 10 um. In various embodiments, the second roughness surface 610 has the roughness in a range from about 3 um to about 8 um.

In embodiments, each zigzag includes a width and a depth, and an aspect ratio of the depth to the width is in a range from about 0.2 to about 1. In various embodiments, the aspect ratio is in a range from about 0.4 to about 0.8.

In some embodiments, a gettering layer is formed before depositing the liner 194. Please referring to FIG. 6C, a gettering layer 620 is deposited to wrap over the first roughness surface 192, and then the liner 194 is formed to cover the gettering layer 620. In various embodiments, the gettering layer 620 is formed of polysilicon.

Figure 7:
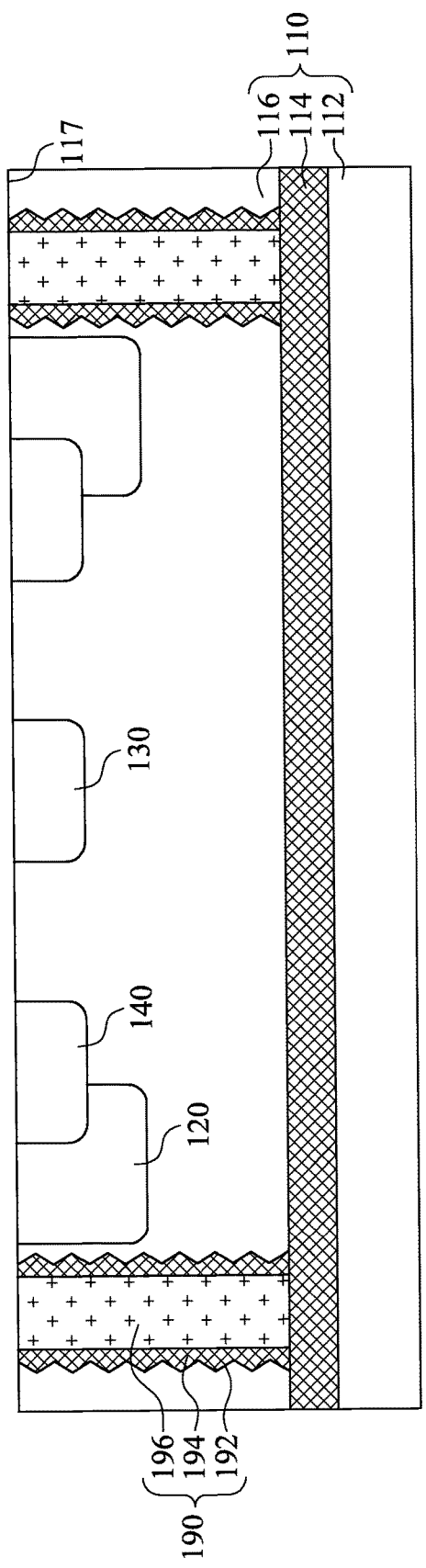

Referring to FIG. 7, FIG. 7 illustrates an intermediate stage of fabrication continued from FIG. 6A. As shown in FIG. 7, the trench hard mask 420 is removed, and the first well 130 and second wells 140 are formed in the semiconductor layer 116. The first well 130 has the first type of conductivity, and the second wells 140 have the second type of conductivity. For example, the first well 130 has an n-type dopant, such as phosphorus or arsenic, and the second wells 140 have a p-type dopant, such as boron or $BF_2$. The first well 130 and the second wells 140 may be formed by a plurality of processing steps, such as growing a sacrificial oxide on the semiconductor layer 116, opening a pattern for the location(s) of the wells 130 and 140, and implanting the dopants. In embodiments, the first well 130 and second wells 140 may be formed using ion implantation, plasma-based ion implantation, gaseous or solid source thermal diffusion, deposition, or combinations thereof. In various embodiments, a p-type dopant concentration in the second wells 140 is in a range from about $10^{15}$ atoms/cm$^3$ to about $10^{16}$ atoms/cm$^3$, and an n-type dopant concentration in the first well 130 is in a range from about $10^{15}$ atoms/cm$^3$ to about $10^{16}$ atoms/cm$^3$.

Figure 8:
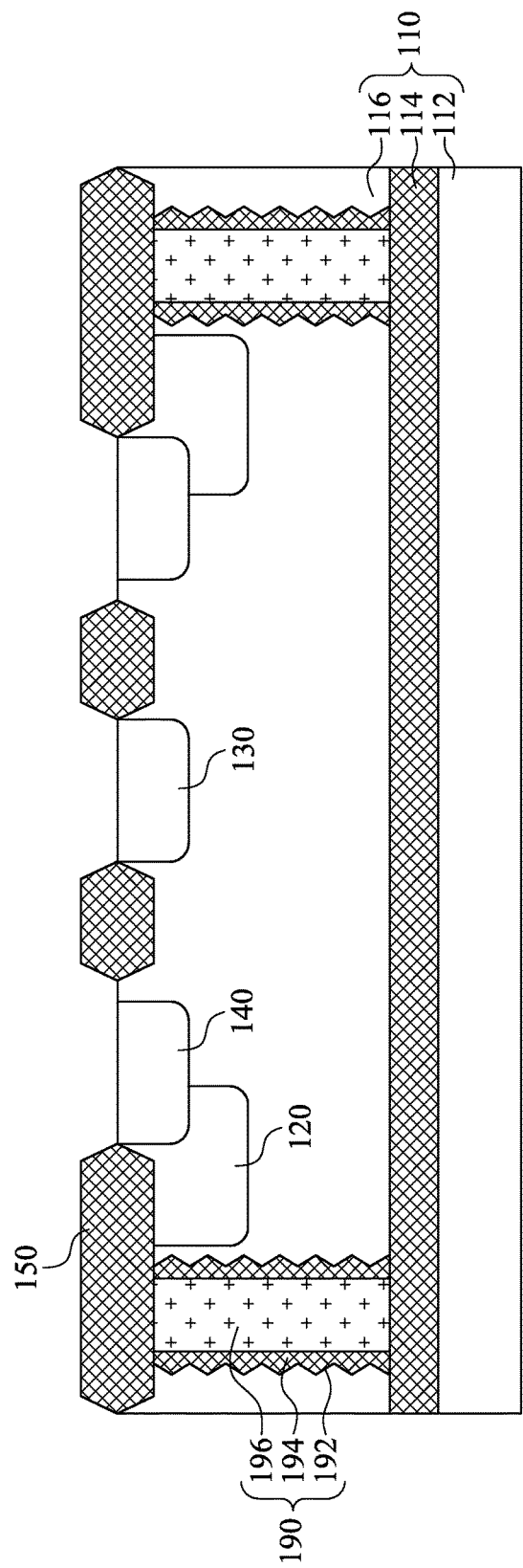

Referring to FIG. 8, the field oxide 150 is formed on the semiconductor layer. The field oxide 150 may include silicon oxide, silicon nitride, silicon oxynitride, aluminum oxide, or other suitable materials. The field oxide 150 may be formed using chemical vapor deposition (CVD), physical vapor deposition (PVD), atomic layer deposition (ALD), thermal oxide, other suitable processes, or combinations thereof.

Figure 9:
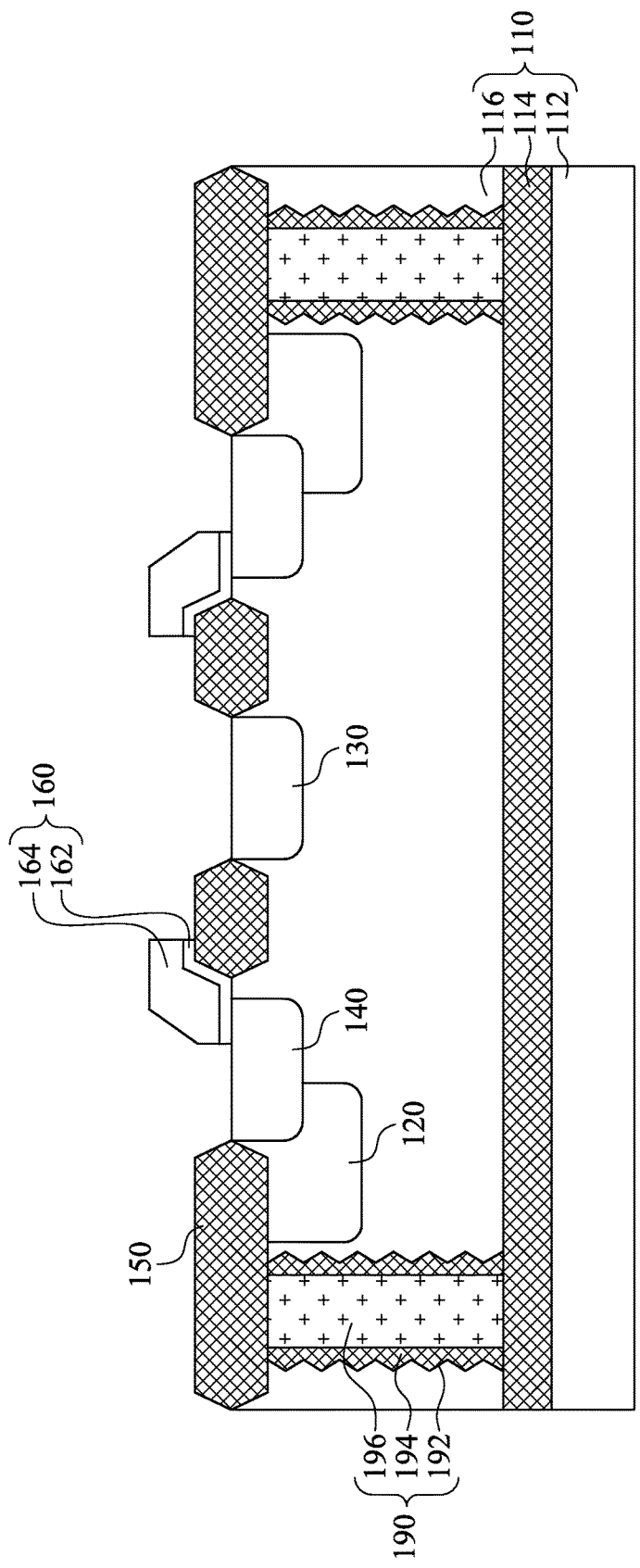

Continuing in FIG. 9, the gate structure 160 is formed over the semiconductor layer 116. As shown in FIG. 9, the gate structure 160 includes the gate dielectric 162 and the gate electrode 164 on the gate dielectric 162. The gate structure 160 includes a first portion overlying the second well 140, a second portion overlying the semiconductor layer 116, and a third portion overlying the field oxide 150. The precise overlay of the gate structure 160 on these areas is achieved by a process including photolithography patterning and etching. One exemplary method for patterning the gate dielectric 162 and gate electrode 164 over these areas is described below. A gate dielectric layer is formed on the semiconductor layer 116, and a gate electrode layer is formed on the gate dielectric layer. Also, a photoresist layer is formed on the gate electrode layer by a suitable process, such as spin-on coating, and then patterned to form a patterned photoresist feature by a proper lithography patterning method. The pattern of the photoresist could be transferred by a dry etching process to the underlying gate electrode layer and the gate dielectric layer to form the gate electrode 164 and the gate dielectric 162, in a plurality of processing steps and various proper sequences, and the photoresist layer is stripped thereafter.

Figure 10:
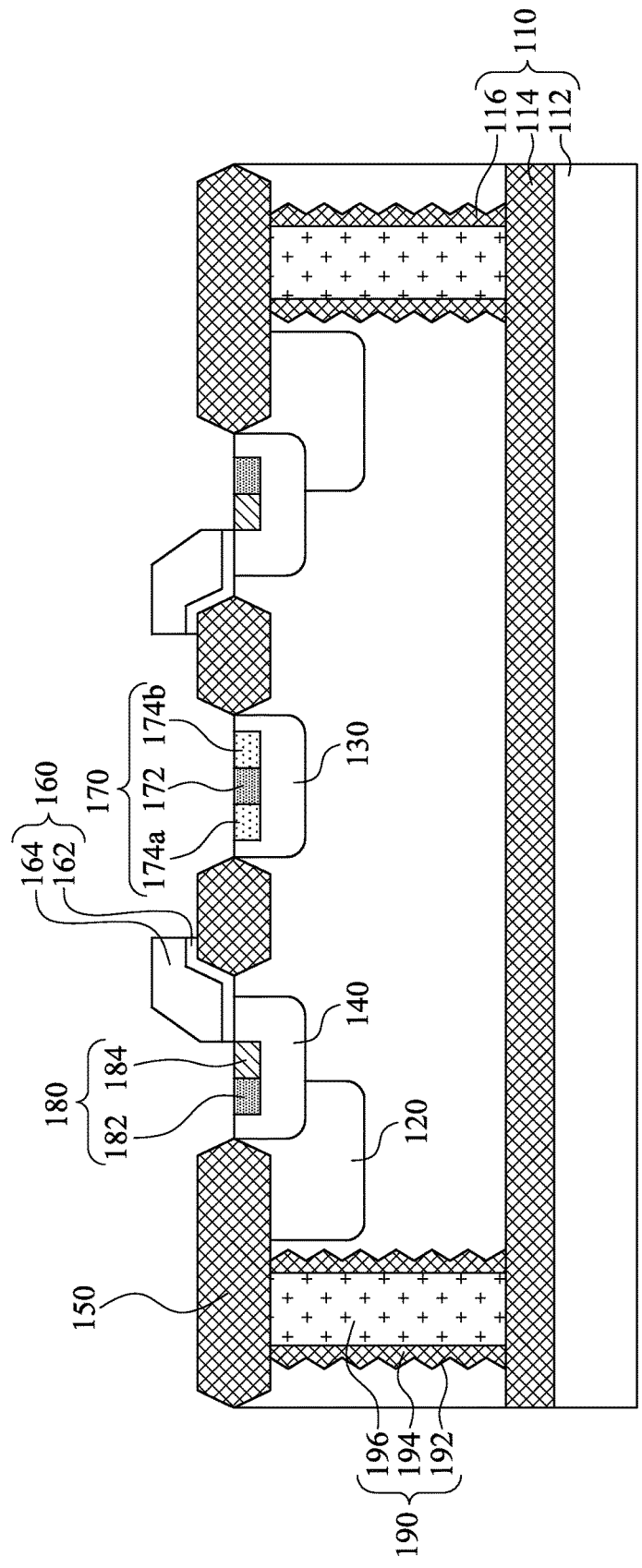

Referring to FIG. 10, a source region 180 is formed in the second well 140, and a drain region 170 is formed in the first well 130. As shown in FIG. 10, the source region 180 includes the first source region 182 and the second source region 184. The first source region 182 has the second type of conductivity, and the second source region 184, formed next to the first source region 182, has the first type of conductivity. For example, the first source region 182 has a p-type dopant, such as boron or $BF_2$, and the second source region 184 has an n-type dopant, such as phosphorus or arsenic. In embodiments, first source region 182 and the second source region 184 may be formed using ion implantation, plasma-based ion implantation, gaseous or solid source thermal diffusion, deposition, or combinations thereof. In various embodiments, a p-type dopant concentration in the first source region 182 is in a range from about $10^{18}$ atoms/cm$^3$ to about $10^{19}$ atoms/cm$^3$, and an n-type dopant concentration in the second source region 184 is in a range from about $10^{18}$ atoms/cm$^3$ to about $10^{19}$ atoms/cm$^3$.

The drain region 170 also includes a first drain region 172 and a second drain regions 174a and 174b both having the second type of conductivity, and the first drain region 172 is interposed between the second drain regions 174a and 174b. For example, the first drain region 172, the second drain regions 174a and 174b have the p-type dopant, such as boron or $BF_2$. But the first drain region 172 is heavily doped with the p-type dopant, and the second drain regions 174a and 174b are lightly doped with the p-type dopant. In embodiments, the first source region 182 and the second source region 184 may be formed using ion implantation, plasma-based ion implantation, gaseous or solid source thermal diffusion, deposition, or combinations thereof. In various embodiments, a p-type dopant concentration in the first drain region 172 is in a range from about $10^{18}$ atoms/cm$^3$ to about $10^{19}$ atoms/cm$^3$, and a p-type dopant concentration in the second drain regions 174a and 174b is in a range from about $10^{15}$ atoms/cm$^3$ to about $10^{16}$ atoms/cm$^3$.

These regions may be doped at the same time. In embodiments, the first drain region 172 and the first source region 182 are doped at the same time. In various embodiments, the first drain region 172 and the first source region 182 are doped at different times.

In various embodiments, an n-type lightly doped region is formed in the second well 140 before forming the second source region 184, and a p-type lightly-doped regions are formed respectively in the first well 130 and the second well 140 before forming the first drain region 172 and the first source region 182. In embodiments, the n-type lightly doped region and p-type lightly doped region may be formed using ion implantation, plasma-based ion implantation, gaseous or solid source thermal diffusion, deposition, or combinations thereof. In various embodiments, a p-type dopant concentration in the p-type lightly doped region is in a range from about $10^{16}$ atoms/cm$^3$ to about $10^{17}$ atoms/cm$^3$, and an n-type dopant concentration in the p-type lightly-doped region is in a range from about $10^{16}$ atoms/cm$^3$ to about $10^{17}$ atoms/cm$^3$.

Although the roughness surface of the insulation structure described above is in connection with an IGBT device, but it is to be understood that the roughness surface equally applicable to other types of semiconductor devices, such as FinFET, PMOS, NMOS, CMOS, flash memory devices, or other suitable semiconductor devices.

The embodiments of the present disclosure discussed above have advantages over existing devices and processes, and the advantages are summarized below. The present disclosure provides the isolating structure having the roughness surface. Since the roughness surface has larger entropy than a flat surface, impurities in the semiconductor layer of the SOI substrate could be gettered by the roughness surface, and these unwanted impurities will be trapped in the isolating structure. Thus, semiconductor devices fabricated in the semiconductor layer prevents current leakage or voltage swell, and the gate oxide integrity (GOI) performance will be enhanced significantly. Besides, an implanter used for implanting the p-type dopant and the n-type dopant is also applied to roughen the sidewalls of the trench. Therefore, the roughness surface could be formed without extra costs.

In accordance with some embodiments, the present disclosure discloses a semiconductor structure. The semiconductor structure includes a substrate, a semiconductor device in the substrate, and an isolating structure in the substrate and adjacent to the semiconductor device. The isolating structure has a roughness surface at a sidewall of the isolating structure, and the roughness surface includes carbon atoms thereon.

In accordance with various embodiments, the present disclosure discloses a silicon-on-insulator (SOI) semiconductor structure. The SOI semiconductor structure includes a handle substrate, an insulating layer on the handle substrate, and a semiconductor layer on the insulating layer. An trench extending from a top surface of the semiconductor layer to a contact surface between the semiconductor layer and the insulating layer, which the trench has a first roughness surface at a sidewall of the trench. Besides, the first roughness surface includes carbon atoms thereon.

In accordance with various embodiments, the present disclosure discloses a method of manufacturing a semiconductor structure. The method begins with forming a semiconductor device in a substrate, and an etching process is performed through the substrate to form a trench. A sidewall of the trench is roughened, and the trench filled with a dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a semiconductor device in the substrate; and
   an isolating structure in the substrate and adjacent to the semiconductor device, the isolating structure having a roughness surface at a sidewall of the isolating structure, wherein the roughness surface comprises carbon atoms thereon and has a roughness in a range from about 2.5 µm to about 10 µm.

2. The semiconductor structure of claim 1, wherein the substrate is a bulk substrate.

3. The semiconductor structure of claim 1, wherein the substrate is a silicon-on-insulator (SOI) substrate, the substrate comprising:
   a handle substrate;
   an insulating layer on the handle substrate; and
   a semiconductor layer on the insulating layer.

4. The semiconductor structure of claim 3, wherein a lattice constant of the insulating layer is different from that of the semiconductor layer.

5. The semiconductor structure of claim 3, wherein the isolating structure is extended form a top surface of the semiconductor layer to a contact surface between the semiconductor layer and the insulating layer.

6. The semiconductor structure of claim 1, further comprising a plurality of isolating structures, and wherein the isolating structures occupy at least 1 percent of a surface area of the substrate.

7. The semiconductor structure of claim 1, wherein the roughness is in a range from about 3 um to about 8 um.

8. The semiconductor structure of claim 1, wherein the roughness surface has a zigzag-shape profile, and each zigzag has an aspect ratio in a range from about 0.2 to about 1.

9. The semiconductor structure of claim 8, wherein the aspect ratio of the zigzag-shape profile is in a range from about 0.4 to about 0.8.

10. A silicon-on-insulator (SOI) semiconductor structure, comprising:
    a handle substrate;
    an insulating layer on the handle substrate;
    a semiconductor layer on the insulating layer; and
    a trench extending from a top surface of the semiconductor layer to a contact surface between the semiconductor layer and the insulating layer, the trench having a first roughness surface at a sidewall of the trench, wherein the first roughness surface comprises carbon atoms thereon and has a zigzag-shape profile, each zigzag having an aspect ratio in a range from about 0.2 to about 1.

11. The SOI semiconductor structure of claim 10, further comprising:
    a liner covering the first roughness surface; and
    a dielectric material filling the trench.

12. The SOI semiconductor structure of claim 11, further comprising a gettering layer interposed between the first roughness surface and the liner, wherein the gettering layer is formed of polysilicon.

13. The SOI semiconductor structure of claim 11, wherein the liner comprises a second roughness surface at a sidewall of the liner.

14. The SOI semiconductor structure of claim 10, wherein the semiconductor structure comprises a plurality of trenches, and the trenches occupy at least 1 percent of an area of the semiconductor layer.

15. The SOI semiconductor structure of claim 10, wherein the first roughness surface has a roughness in a range from about 2.5 um to about 10 um.

16. The SOI semiconductor structure of claim 10, wherein an insulated gate bipolar transistor (IGBT) device is fabricated in the semiconductor layer.

17. The SOI semiconductor structure of claim 10, wherein the first roughness surface has a roughness in a range from about 2.5 um to about 10 um.

18. The SOI semiconductor structure of claim 17, wherein the roughness is in a range from about 3 um to about 8 um.

* * * * *